(12) United States Patent
Alger et al.

(10) Patent No.: US 8,307,548 B2
(45) Date of Patent: Nov. 13, 2012

(54) METHOD OF MAKING A FIBER REINFORCED PRINTED CIRCUIT BOARD PANEL AND A FIBER REINFORCED PANEL MADE ACCORDING TO THE METHOD

(75) Inventors: William O. Alger, Portland, OR (US); Gary B. Long, Aloha, OR (US); Gary A. Brist, Yamhill, OR (US); Bryce D. Horine, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 88 days.

(21) Appl. No.: 12/882,122

(22) Filed: Sep. 14, 2010

(65) Prior Publication Data

US 2010/0328919 A1 Dec. 30, 2010

Related U.S. Application Data

(62) Division of application No. 11/282,874, filed on Nov. 17, 2005, now Pat. No. 7,843,057.

(51) Int. Cl.
*H05K 3/02* (2006.01)
*B29C 65/00* (2006.01)

(52) U.S. Cl. .......................................... 29/846; 156/250
(58) Field of Classification Search .................. None
See application file for complete search history.

(56) References Cited

U.S. PATENT DOCUMENTS

| | | | |
|---|---|---|---|
| 6,603,201 B1 | 8/2003 | Thavarajah et al. | |
| 7,676,917 B2 | 3/2010 | McCall et al. | |
| 2005/0028925 A1* | 2/2005 | Fernandes et al. | 156/269 |
| 2005/0034893 A1 | 2/2005 | McCall et al. | |
| 2006/0076683 A1 | 4/2006 | Nishida | |
| 2006/0120059 A1 | 6/2006 | Farkas | |

OTHER PUBLICATIONS

PCT/US2006/044583, Nov. 16, 2006, International Search Report.
Gary Brist et al., "Woven Glass Reinforcement Patterns", Printed Circuit Design and Manufacture, Nov. 2004, pp. 28-33.
Howard Heck et al., "AC Common Mode Conversion in Multi-Gb/s Differential Printed Circuit Boards", Intel Design and Test Technology Conference, 2004, pp. 1-8.
Taiwan Patent Application No. 05142430 Office Action Primary Examination dated Mar. 11, 2011 corresponding to U.S. Appl. No. 12/882,122.
Chinese Patent Application No. 200680038540.2 First Office Action dated Nov. 9, 2009 corresponding to U.S. Appl. No. 12/882,122.
Singapore Patent Application No. 200803222-9 First Office Action dated Jul. 31, 2009 corresponding to U.S. Appl. No. 12/882,122.

* cited by examiner

*Primary Examiner* — Camie Thompson
(74) *Attorney, Agent, or Firm* — Blakely, Sokoloff, Taylor & Zafman LLP

(57) ABSTRACT

A method of making a printed circuit board panel, a printed circuit board panel made according to the method, and a system incorporating a printed circuit board provided onto the panel. The printed circuit board panel has a panel top edge, a panel bottom edge parallel to the panel top edge, and two parallel panel side edges, and further includes a first set of fiber bundles extending at the predetermined angle with respect to the panel side edges, and a second set of fiber bundles extending at the predetermined angle with respect to the panel top edge.

14 Claims, 4 Drawing Sheets

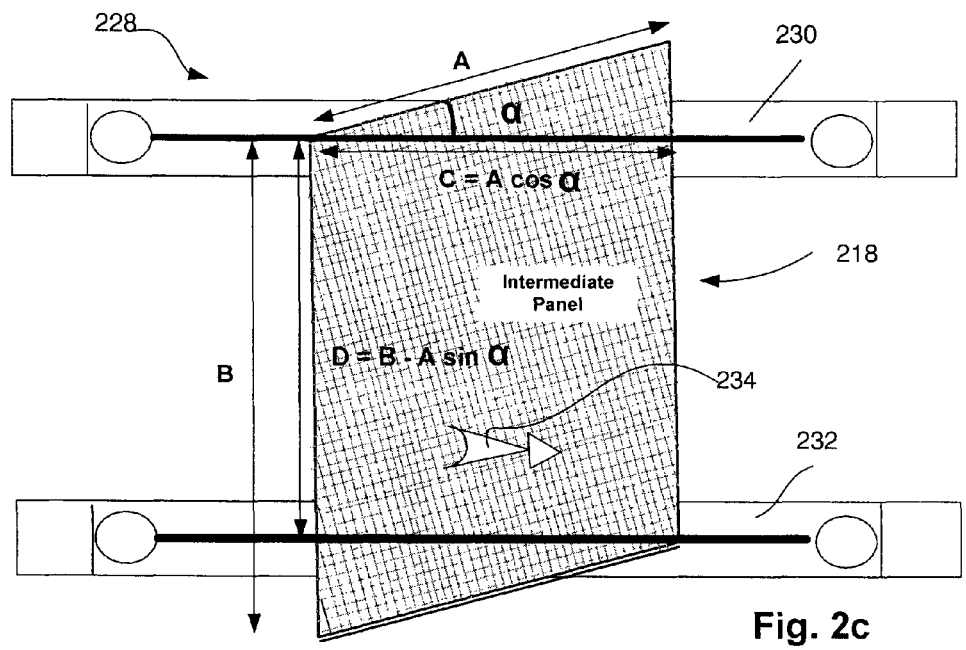
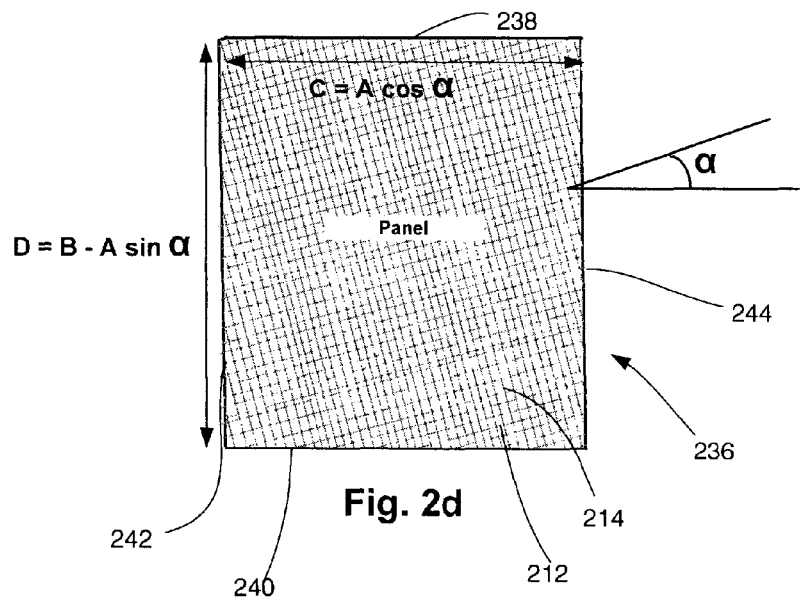

METHOD OF MAKING A FIBER REINFORCED PRINTED CIRCUIT BOARD PANEL AND A FIBER REINFORCED PANEL MADE ACCORDING TO THE METHOD

This is a Divisional Application of Ser. No.: 11/282,874 filed Nov. 17, 2005, now U.S. Pat. No. 7,843,057.

FIELD

Embodiments of the present invention relate to fiber reinforced panels for printed circuit boards, and to methods of forming such panels.

BACKGROUND

Signals are transferred across printed circuit boards (PCB's) typically using PCB interconnects in the form of linearly disposed conductive transmission lines, such as transmission lines routed according to a standard Manhattan method. A transfer rate of a signal across a transmission line is among other things a function of an effective dielectric constant of the board or panel underlying the transmission line's trajectory. Conventional panels may be made from a thermoset resin such as an epoxy filled with a fibrous reinforcement such as glass fiber to form a board. An example of such a board includes FR4, a schematic illustration of which is provided as panel 101 in FIG. 1. FIG. 1 shows a portion 100 of a printed circuit board including an FR4 panel 101 and two transmission lines 110 and 112 on the panel 101 according to the prior art.

As seen in FIG. 1, as transmission line, such as lines 110 and 112, advance on a given panel, they each cross over areas of the panel exhibiting varying dielectric constants by virtue of spatially varying woven fiber densities within the panel. An effective dielectric constant of the panel underlying the transmission line's trajectory would therefore in effect correspond to an averaging of the varying dielectric constants. For a given bus layout design, bus lines typically run over paths on the panel that may substantially different from one another. As seen in FIG. 1, the two lines 110 and 112 are shown as having trajectories that extend over substantially different physical regions of the panel, the two lines thus having widely varying signal transfer rates. Where differential signals are transmitted through the transmission lines of a bus, the localized spatial variations in PCB panels of effective dielectric constants create a phase skew in the signals being transmitted. This phase skew converts differential signals to common mode as the signals propagate along the PCB transmission lines, the above phenomenon being commonly referred to as "mode conversion." As transfer rate requirements of PCB transmission lines increase into the multi Gb/s range, the allowable timing tolerance between different lines on the PCB panel shrink correspondingly, up to a point where resulting local variations in dielectric constant cause appreciable voltage and timing noise, and phase skews that dramatically reduce signaling data rates, leaving an insufficient margin for other effects, such as transmitter jitter, ISI, and crosstalk, to name just a few.

The prior art mitigates the problem of phase skew as noted above according to a number of different options. Some of these options are discussed below.

One option involves routing predetermined pairs of transmission lines at an angle relative to the weave direction to average out dielectric constant variations by constantly changing the relative position of the transmission lines relative to the bundles. For example, routing at a 45 degree angle can reduce phase skew. Another option entails using design rules that place a maximum length limit on pairs of transmission lines beyond which the pair must shift to a different track. By offsetting the routing tracks by one half of the weave pitch, mode conversion can be cancelled by matching the trace lengths for each track. A third option mitigates mode conversion by rotating the image of the tracks relative to the entire panel, such as by 3 to 5 degrees. However, the above option generates a fair amount of waste with respect to unused portions of the board onto which the rotated image is not transferred.

All of the above options are disadvantageous to the extent that they complicate a fabrication of the PCB by adding fabrication stages, decreasing fabrication efficiency, and adding cost. In addition, the option of routing predetermined pairs of transmission lines at an angle relative to the weave direction is feasible sometimes only by adding panel layers in order to compensate for a possible shortage of panel surface area as brought about as a result of an angling of selected transmission lines.

Other mode conversion mitigation options include the use of fiber reinforced materials that use a tighter weave to reduce the gap between bundles, an elimination of the fiberglass cloth using only the resin, or the use of chopped fiberglass to randomize dielectric constant variations. However, disadvantageously the latter options are either expensive to implement and/or not applicable to the entire extent of the panel being used.

The prior art has failed to provide a reliable and cost-effective method of mitigating phase skew in differential signals caused by localized spatial variations in the dielectric constants of PCB panels.

BRIEF DESCRIPTION OF THE DRAWINGS

Embodiments of the invention are illustrated by way of example and not by way of limitation in the figures of the accompanying drawings, in which the like references indicate similar elements and in which:

FIGS. 2a, 2c and 2d show a shearing station depicting stages in the fabrication of a printed circuit board panel according to an embodiment;

DETAILED DESCRIPTION

A method of making a printed circuit board panel, a printed circuit board panel made according to the method, and a system incorporating a printed circuit board provided onto the panel are described herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention, however, the order of description should not be construed as to imply that these operations are necessarily order dependent. In particular, these operations need not be performed in the order of presentation.

The phrase "one embodiment" is used repeatedly. The phrase generally does not refer to the same embodiment, however, it may. The terms "comprising", "having" and "including" are synonymous, unless the context dictates otherwise.

Embodiments pertain in general to methods of forming a fiber reinforced panel for a printed circuit board and to a fiber reinforced panel formed according to the method.

Figure 1:
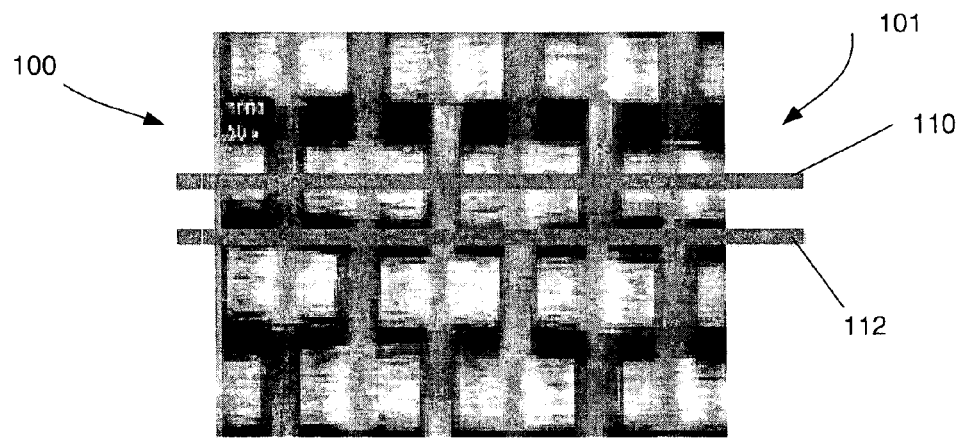
FIG. 1 is a top plan view of a portion of a fiber reinforced panel comprising transmission lines thereon provided according to the prior art.
Figure 2A:
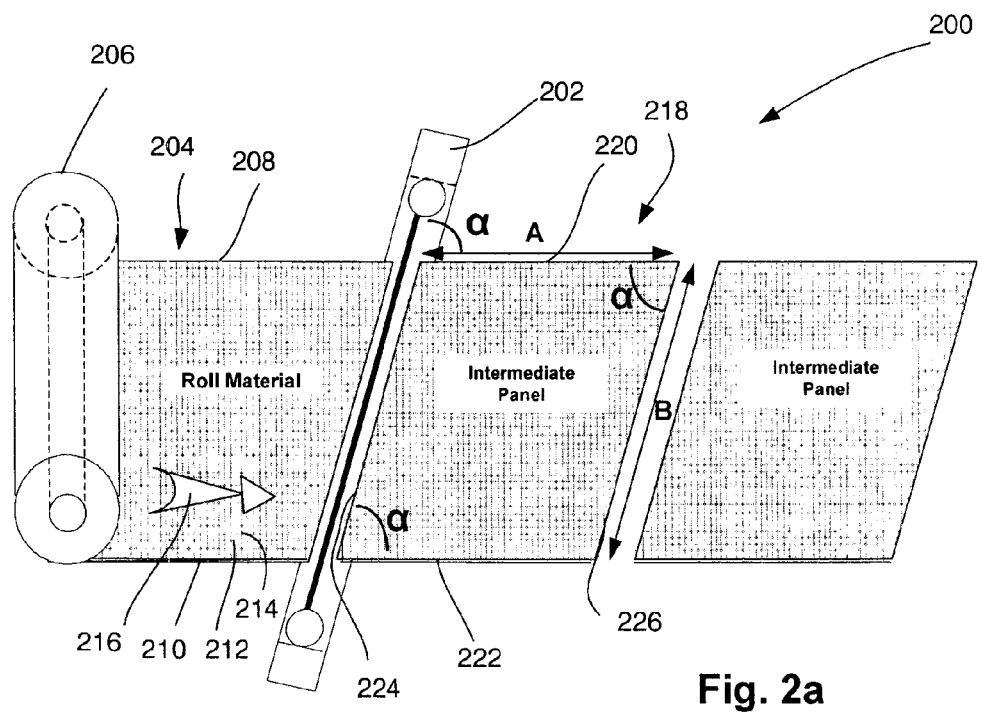
Figure 2B:
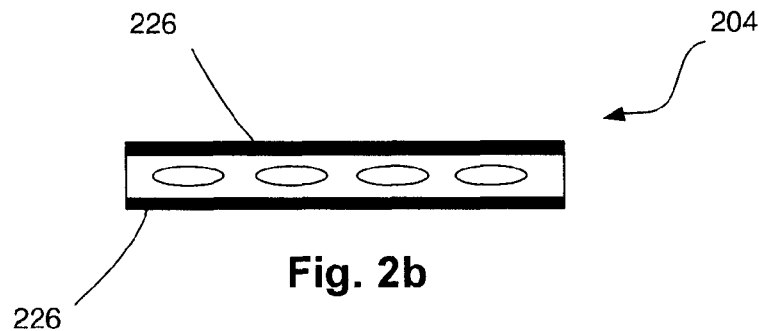
FIG. 2b shows a conventional copper clad fiber reinforced material.

Referring now to FIG. 2a by way of example, method embodiments of the present invention comprise: providing a fiber containing sheet, the sheet having a sheet front edge, a sheet top edge and a sheet bottom edge extending parallel to the sheet top edge, the sheet further comprising a first set of fiber bundles extending parallel to the sheet top edge, and a second set of fiber bundles extending at right angles to the sheet top edge; and cutting the fiber containing sheet at a predetermined angle α with respect to the sheet top edge to yield a intermediate panel having a intermediate panel top edge and an intermediate panel bottom edge extending parallel to one another, and two parallel edges each extending at the predetermined angle with respect to the intermediate panel top edge. The fiber containing sheet according to embodiments may comprise, by way of example, a sheet consisting of (that is, containing exclusively) the fibers as described above, or a sheet comprising a fiber reinforced material (i.e. a sheet containing the fibers as described above impregnated with an impregnating material such as resin). Thus, a fiber containing sheet may include a sheet of fiber reinforced material that is either copper clad or reinforced with one or more layers of a reinforcing material, such as resin. In the fiber containing sheet, each set of fiber bundles as shown may include individual bundles extending parallel to one another and spaced apart by a given pitch. Thus, as seen in particular in FIG. 2a, according to an embodiment, a first shearing station 200 is shown including a shear apparatus 202. A fiber containing sheet 204 is provided in rolled form on a roll 206 as shown. The shown sheet, as noted above, may include a fiber reinforced material such as a resin reinforced with fiber glass bundles oriented perpendicularly with respect to one another and woven to strengthen the resulting panel for a PCB. Examples of such fiber reinforced materials include FR4 or CEM. The sheet as shown has a sheet top edge 208 and a sheet bottom edge 210 that is parallel to the sheet top edge, a first set of fiber bundles 212 extending parallel to the sheet top edge, and a second set of fiber bundles 214 extending at right angles to the sheet top edge. By "top" or "bottom," the instant description is not necessarily referring to an orientation in fact of the sheet at the first shearing station, but rather to the orientation as shown in the figures for ease of description, denoting a relative positioning of different parts of the sheet. At the first shearing station 200, according to an embodiment, the sheet 204 is advanced toward the shear apparatus 202 in an advancing direction 216. According to an embodiment, the shear apparatus 202 is oriented according to an embodiment to cut the sheet 204 at a predetermined angle α with respect to the sheet top edge 208 or with respect to the advancing direction 216 as shown. The sheet may be advanced in one embodiment on a conveyor. As seen in FIG. 2a, shear apparatus 202 is adapted to cut the fiber containing sheet 204 at the predetermined angle α with respect to the sheet top edge 208 to yield a intermediate panel 218 having a intermediate panel top edge 220 and a intermediate panel bottom edge 222 extending parallel to one another, and two parallel intermediate panel edges 224 and 226 respectively, each of the parallel intermediate panel edges extending at the predetermined angle with respect to the intermediate panel top edge 220. Preferably, as shown in the embodiment of FIG. 2a, the intermediate panel is a parallelogram. The intermediate panel top edge 220 and intermediate panel bottom edge 222 have a dimension A as shown, and the parallel intermediate panel edges 224 and 226 have a dimension B as shown. Within intermediate panel 218, the first set of fiber bundles 212 extends at the predetermined angle α with respect to each of the two parallel intermediate panel edges 224 and 226, and the second set of fiber bundles 214 extends perpendicularly with respect to the intermediate panel top edge 220. According to a preferred embodiment, the sheet 204 includes a raw fiber reinforced material, that is, a fiber reinforced material that consists of fiber bundles, such as glass fiber bundles, extending in two directions that are perpendicular to one another, and a resin impregnating those fiber bundles. Thus, a "raw" fiber reinforced material as referred to herein does not include further coatings thereon, such as copper cladding or further coatings of resin. Examples of a raw fiber-reinforced material include an FR4 or a CEM material that has not been copper clad or hardened such as with a resin. According to a preferred embodiment, the sheet is dispensed from a sheet roll, such as sheet roll 206 of FIG. 2a. According to an embodiment, the sheet comprises copper cladding thereon, as shown in FIG. 2b. Thus, as shown in FIG. 2b, the sheet 204 according to an embodiment may include copper cladding 226 thereon, the copper cladding 226 having been provided for example by either being laminated onto the fiber reinforced sheet 204 or by being electrolytically deposited thereon, as would be recognized by one skilled in the art.

As next seen in FIG. 2c by way of example, method embodiments further comprise cutting the intermediate panel along two lines parallel to one another and perpendicular to each of the two parallel intermediate panel side edges to yield a panel having a panel top edge, a panel bottom edge parallel to the panel top edge, and two parallel panel side edges, the panel having a first set of fiber bundles extending at the predetermined angle with respect to the side edges, and a second set of fiber bundles extending at the predetermined angle with respect to the panel top edge. It is noted that "panel" as used herein is not limited to a panel having the size of a panel adapted to have PCB components provided thereon. Thus, "panel" as used herein, or "PCB panel," may refer equally as well (1) to a sheet of material larger than a panel adapted to have PCB components provided thereon, where the sheet could later be separated into individual panels adapted to have PCB components provided thereon, and (2) to a sheet of material having the size of a panel adapted to have PCB components provided thereon. In the instant description, a panel is "adapted to have PCB components provided thereon" when the panel no longer needs to be reduced in size before provision of the PCB components.

Referring back to FIG. 2c, a second shearing station 228 is provided which includes two trim parallel shears 230 and 232 as shown, the shears being positioned to cut in a direction parallel to one another. The two parallel trim shears may be set apart at a distance D from one another as shown. Preferably, the distance D between trim shears 230 and 232 is obtained according to Equation (1) as noted below:

$$D = B - A \sin \alpha \quad (1)$$

As seen in FIG. 2c, an embodiment comprises advancing the panel 218 along an advancing direction 234 as shown. It is noted however that embodiments are not limited to the use of two trim shears, or to a distance between two trim shears that is set according to Equation (1) above. Embodiments comprise within their scope a cutting of the intermediate panel 218 along two lines L1 and L2 that may be spaced apart at a distance other than distance D as set forth in Equation (1), and further a cutting as noted above which may be effected in any well known manner, such as, for example, using one or more trim shears, or a cutting tool other than a trim shear. As seen in the embodiment of FIG. 2c, lines L1 and L2 may be parallel to one another and perpendicular to each of the two parallel edges 230 and 232 to yield a panel 236. As seen in FIG. 2d, the panel has a panel top edge 238, a panel bottom edge 240 parallel to the panel top edge, and two parallel panel side edges 242 and 244, the panel 236 having the first set of fiber bundles 212 extending at the predetermined angle α with respect to the panel side edges 242 and 244, and the second set of fiber bundles 214 extending at the predetermined angle α with respect to the panel top edge 238. Preferably, a cutting of the intermediate panel is effected such that the lines L1 and L2 are separated by the distance D as noted in Equation (1) to yield a panel 236 in the shape of a rectangle as shown in FIG. 2c. As seen in FIG. 2c, the resulting panel 236 may have a dimension D as provided by Equation (1) above, and a dimension C as provided by Equation (2) below:

$$C = A \cos \alpha \quad (2)$$

Where, as noted above, A is a dimension of the intermediate panel top edge 220 as shown in FIG. 2a. A panel according to an embodiment, before its separation into individual panels adapted to have PCB components provided thereon, may have any of the following dimensions: 18 inches by 24 inches, 48 inches by 48 inches, 52 inches by 48 inches and 56 inches by 56 inches, to cite just a few.

The predetermined angle α is an angle chosen to mitigate mode conversion as described above based on application needs, depending on factors such as a physical configuration of the transmission lines and an operating frequency and edge rate of the signals to be transmitted by the transmission lines, as would be recognized by one skilled in the art. The predetermined angle could be chosen, for example, in the same manner as an angle would be chosen in the prior art for an image rotation of the transmission line image to be transferred onto a panel in order to mitigate mode conversion. Preferably, according to a preferred embodiment, the predetermined angle α is a smallest angle that is adapted to result in a substantial elimination of mode conversion. More preferably, the predetermined angle α is below about 22.5 degrees. More preferably, the predetermined angle is about 10 degrees.

Figure 3:
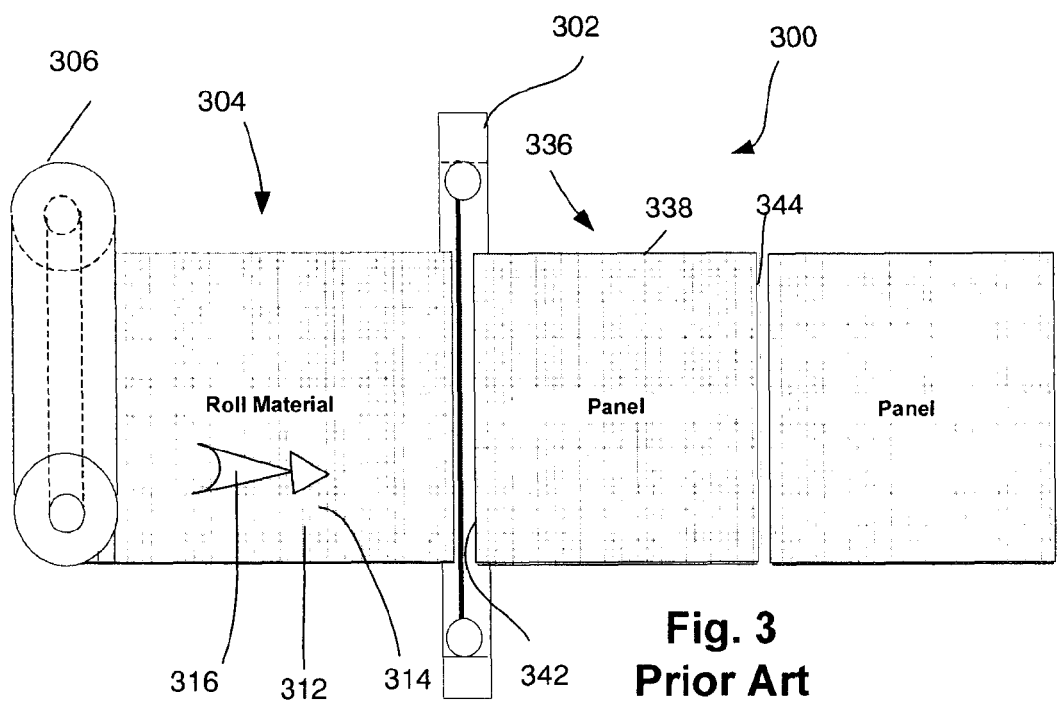
FIG. 3 shows a shearing station depicting a fabrication of a printed circuit board panel according to the prior art.

Referring next to FIG. 3, a prior art arrangement is shown in which a shearing station 300 includes a shear apparatus 302. A sheet 304 of fiber reinforced material is provided on a roll 306 as shown. At the shearing station 300, according to an embodiment, the sheet 304 is advanced toward the shear apparatus 302 in an advancing direction 316. The prior art orients the shear apparatus 302 perpendicular to the advancing direction 316, resulting in a prior art panel 336 having a first set of fiber bundles 312 extending perpendicularly to the side edges 342 and 344, and the second set of fiber bundles 314 extending perpendicularly with respect to the panel top edge 338. It is clear from FIG. 3 that, in order to provide transmission line routing on panel 336 that is angled with respect to the fiber bundles to mitigate mode conversion in a PCB, a clear option would involve image rotation, which would entail all of the disadvantages noted above with respect to the same. Conversely, a panel such as panel 236 of FIG. 2d allows the provision of transmission lines thereon according to standard methods while having the transmission lines be routed in an angled manner with respect to the fiber bundles, and while at the same time avoiding the necessity for image rotation.

Advantageously, embodiments provide for the formation of a panel having two sets of fiber bundles extending perpendicularly with respect to each other, one set being oriented at a predetermined angle α with respect to a top edge of the panel, the panel being provided at an initial shearing stage of a fiber reinforced roll material. Once the panel as described above is provided, all remaining down stream laminate and board processes may be performed according to standard methods without the necessity of further mode conversion mitigation, advantageously eliminating any disadvantages associated with such mitigation processes as noted above. For example, embodiments provide for a cost effective method that reduces a waste of fiber reinforced material and of other materials such as copper cladding as compared with a method that uses image rotation for mode conversion mitigation. In addition, embodiments provide for a cost effective method that reduces a waste of processing time and resources typically relating to unused portions of a panel of a PCB that has undergone mode conversion mitigation according to the prior art. Such processing time and resources may typically be expended in the prior art, in the form of, for example, etching, oxidizing, imaging and cleaning, that may be performed on portions of the panel that may have to be thrown away as a result of using prior art mode conversion mitigation methods such as image rotation.

Figure 4:
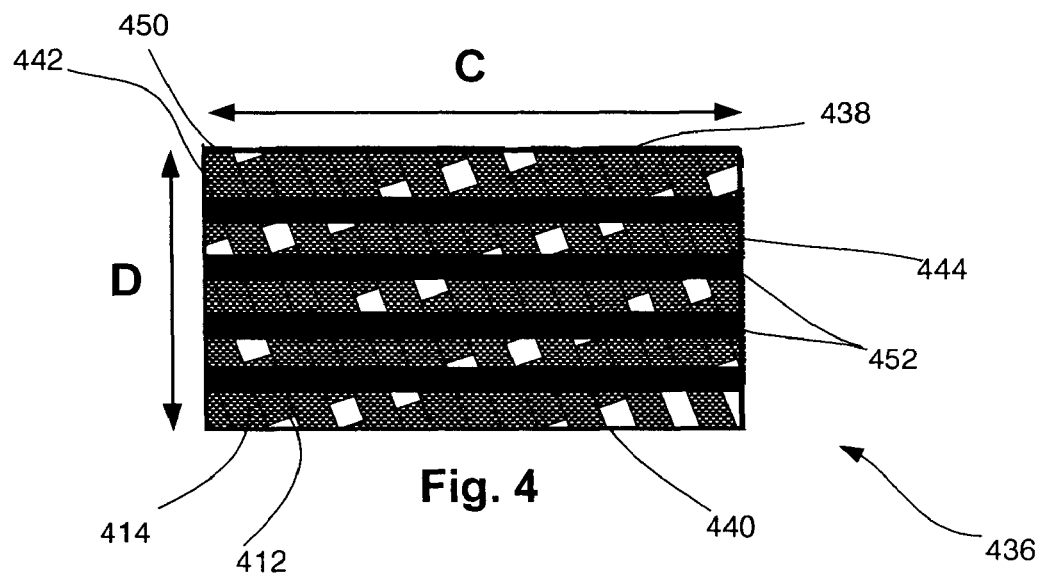
FIG. 4 shows a top plan view of a printed circuit board provided onto a printed circuit board panel according to an embodiment.

Referring next to FIG. 4, a printed circuit board 450 is shown according to an embodiment, the printed circuit board including transmission lines 452 thereon provided on a panel 436 similar to panel 236 of FIG. 2d. Thus, panel 436 includes a panel top edge 438, a panel bottom edge 440 parallel to the panel top edge, and two parallel panel side edges 442 and 444, the panel 436 having the first set of fiber bundles 412 extending at the predetermined angle α with respect to the side edges 442 and 444, and the second set of fiber bundles 414 extending at the predetermined angle α with respect to the panel top edge 438. Printed circuit board 450, the transmission lines 452 of which are shown, is then provided onto panel 436, for example according to well known methods, without the necessity to rotate an image of the transmission lines 452 by the predetermined angle in order to mitigate mode conversion as noted above.

Figure 5:
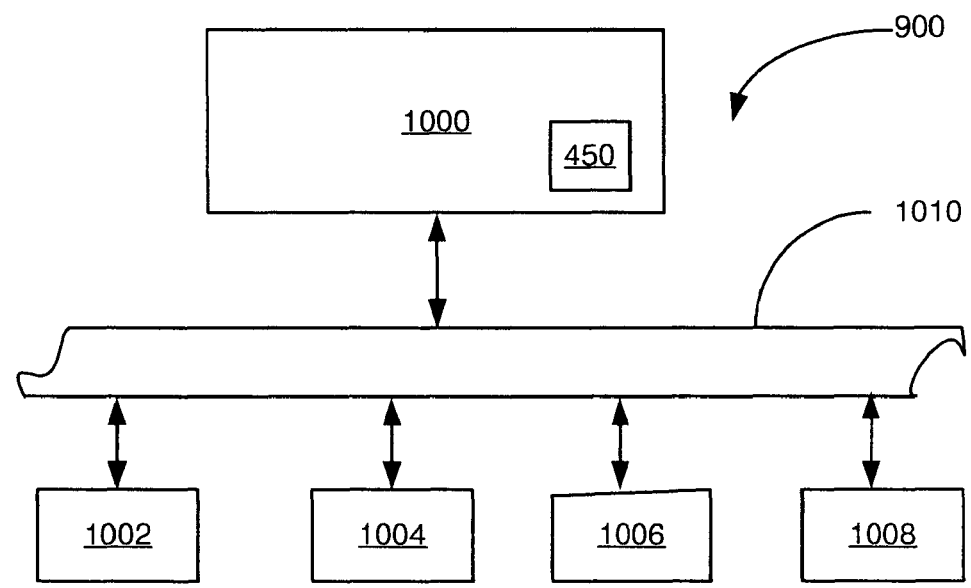
FIG. 5 shows a system incorporating a printed circuit board according to an embodiment.

Referring to FIG. 5, there is illustrated one of many possible systems 900 in which embodiments of the present invention may be used. An electronic assembly 1000 includes a PCB 450 which may be similar to the PCB 450 depicted above in FIG. 4. In one embodiment, assembly 1000 may include a microprocessor. In an alternate embodiment, the may include an application specific IC (ASIC). Integrated circuits found in chipsets (e.g., graphics, sound, and control chipsets) may also be packaged in accordance with embodiments of this invention.

For the embodiment depicted by FIG. 5, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A system comprising:
    an electronic assembly including:
        a printed circuit board comprising:
            a panel comprising a fiber reinforced material, the panel having a panel top edge, a panel bottom edge parallel to the panel top edge, and two parallel panel side edges, the panel further having a first set of fiber bundles extending at a predetermined angle α with respect to the side edges, and a second set of fiber bundles extending at the predetermined angle α with respect to the panel top edge wherein the angle α is above 0 degrees and below about 22.5 degrees;
            circuit components disposed on the panel; and
            parallel transmission lines extending on the panel between the circuit components, the transmission lines being oriented parallel to one of the panel top edge and the panel side edges; and
        a main memory coupled to the electronic assembly.

2. The system of claim 1, wherein the fiber reinforced material comprises an epoxy resin.

3. The system of claim 1, wherein the first set of fiber bundles and the second set of fiber bundles comprise glass fibers.

4. The system of claim 1, wherein the angle α is about 10 degrees.

5. A method of making a printed circuit board panel comprising:
    providing a fiber containing sheet, the sheet having a sheet top edge and a sheet bottom edge extending parallel to the sheet top edge, the sheet further comprising a first set of fiber bundles extending parallel to the sheet top edge, and a second set of fiber bundles extending at right angles to the sheet top edge;
    cutting the sheet at a predetermined angle α with respect to the sheet top edge to yield a intermediate panel having a intermediate panel top edge and an intermediate panel bottom edge extending parallel to one another, and two parallel edges each extending at the predetermined angle α with respect to the intermediate panel top edge; and
    cutting the intermediate panel along two lines parallel to one another and perpendicular to each of the two parallel edges to yield a panel having a panel top edge, a panel bottom edge parallel to the panel top edge, and two parallel panel side edges, the panel having a first set of fiber bundles extending at the predetermined angle α with respect to the side edges, and a second set of fiber bundles extending at the predetermined angle with respect to the panel top edge wherein the angle α is above 0 degrees and below about 22.5 degrees.

6. The method of claim 5, wherein the sheet comprises one of a sheet consisting of the first set of fiber bundles and the second set of fiber bundles, a raw fiber reinforced material, a fiber reinforced material having copper cladding thereon, and a fiber reinforced material having a layer of a reinforcing material thereon.

7. The method of claim 5, wherein cutting a. sheet comprises using a first shearing station comprising shear apparatus oriented to cut the sheet at he predetermined angle α with to the sheet top edge.

8. he method of claim 5, wherein cutting the panel comprises using a second shearing station comprising two parallel shears each adapted to cut the intermediate panel along a corresponding one of the two lines.

9. The method of claim 5, wherein the two lines are separated by a distance equal to a dimension of the intermediate panel side edge minus a multiplied value equaling a dimension of the intermediate panel top edge times the sine of the predetermined angle.

10. The method of claim 5 wherein the angle α is about 10 degrees.

11. A method of fabricating a printed circuit board comprising:
    providing a panel comprising a fiber reinforced material, the panel having a panel top edge, a panel bottom edge parallel to the panel top edge, and two parallel panel side edges, the panel further having a first set of fiber bundles extending at a predetermined angle α with respect to the side edges, and a second set of fiber bundles extending at the predetermined angle α with respect to the panel top edge wherein the angle α is above 0 degrees and below about 22.5 degrees;
    providing circuit components on the panel; and
    providing parallel transmission lines extending on the panel between the circuit components, the transmission lines being oriented parallel to one of the panel top edge and the panel side edges.

12. The method of claim 11, wherein the fiber reinforced material comprises an epoxy resin.

13. The method of claim 11, wherein the first set of fiber bundles and the second set of fiber bundles comprise glass fibers.

14. The method of claim 11, wherein the angle α is about 10 degrees.

* * * * *